US007853914B1

(12) United States Patent
Srinivasan et al.

(10) Patent No.: US 7,853,914 B1
(45) Date of Patent: Dec. 14, 2010

(54) FANOUT-OPTIMIZATION DURING PHYSICAL SYNTHESIS FOR PLACED CIRCUIT DESIGNS

(75) Inventors: Sankaranarayanan Srinivasan, San Jose, CA (US); Kamal Chaudhary, San Jose, CA (US); Amit Singh, San Jose, CA (US); Benoit Payette, Blainville (CA)

(73) Assignee: Xilinx, Inc., San Jose, CA (US)

( * ) Notice: Subject to any disclaimer, the term of this patent is extended or adjusted under 35 U.S.C. 154(b) by 467 days.

(21) Appl. No.: 11/827,531

(22) Filed: Jul. 12, 2007

(51) Int. Cl.
   *G06F 17/50* (2006.01)
(52) U.S. Cl. ............... 716/12; 716/2; 716/6; 716/9
(58) Field of Classification Search .......... 716/2, 716/6, 9, 12
   See application file for complete search history.

(56) References Cited

U.S. PATENT DOCUMENTS 6,205,572 B1 * 3/2001 Dupenloup ............ 716/5

7,222,318 B2 * 5/2007 Srinivasan ............ 716/6

OTHER PUBLICATIONS

Xilinx, Inc.; U.S. Appl. No. 11/361,369; by Singh et al.; filed Feb. 24, 2006.
Xilinx, Inc.; U.S. Appl. No. 11/361,370; by Singh et al.; filed Feb. 24, 2006.
Rajeev Murgai; "On the Global Fanout Optimization Problem"; Copyright 1999 IEEE; ICCAD:1999; pp. 511-515.
Kanwar Jit Sing. et al.; "A Heuristic Algorithm for the Fanout Problem"; Copyright 1990 IEEE; 17th ACM/IEEE Design Automation Conference; pp. 357-360.

* cited by examiner

*Primary Examiner*—Thuan Do
(74) *Attorney, Agent, or Firm*—Kevin T. Cuenot; LeRoy D. Maunu

(57) ABSTRACT

A method of implementing a circuit design for a target device can include assigning load pins of a high fanout signal of a placed circuit design into a plurality of windows according to a location of each load pin on the target device. A source of the high fanout signal can be replicated, wherein each window is associated with a source of the high fanout signal. For each source of the high fanout signal, the source can be connected to load pins of the window associated with the source and the source can be placed within the window associated with the source. The placed circuit design can be output.

14 Claims, 7 Drawing Sheets

US 7,853,914 B1

FANOUT-OPTIMIZATION DURING PHYSICAL SYNTHESIS FOR PLACED CIRCUIT DESIGNS

FIELD OF THE INVENTION

The invention relates to integrated circuit devices (ICs). More particularly, the invention relates to fanout optimization during physical synthesis for placed circuit designs to be implemented within ICs.

BACKGROUND

The process of implementing a circuit design within a particular integrated circuit (IC), referred to as a target device, typically begins with an architecture description of the circuit design. This description can be specified in a hardware description language such as Verilog or VHDL. Most circuit designs have one or more timing requirements that must be observed. The timing requirements can be expressed within the programmatic description of the circuit design or as supplemental information or files accompanying the circuit design.

Electronic Design Automation (EDA) tools can process the circuit design and find an implementation for a given target device that meets the timing requirements. The EDA tool typically converts the HDL description of the circuit design into a gate-level representation of the circuit design. With respect to programmable logic device (PLD) type ICs, such as field programmable gate arrays, the gate level description can be technology mapped to vendor specific structures available within the target device. Elements of the circuit design are assigned to different components of the target device, e.g., lookup tables, flip-flops, and the like.

After technology mapping, delay information for interconnects of the circuit design can be calculated. The delay information for interconnects is effectively an estimation of signal propagation delays within the circuit. Because the circuit design has not yet been placed, this estimation of interconnect delays generally is not considered highly accurate.

The EDA tool then can place the technology mapped circuit design. The various elements of the circuit design, now associated with components of the target device, can be assigned to pre-fabricated sites, or locations, of the target device. The placement task generally can be guided by the delay information available. Connections of the circuit design can be routed to generate a routed circuit design.

Conventional EDA tools often have difficulty in processing signals of the circuit design that are distributed to a large number of load pins. It is often the case that these "high fanout signals" contribute to the failure of the EDA tool to determine a satisfactory implementation of the circuit design, e.g., an implementation that conforms to the established timing requirements.

SUMMARY

The embodiments disclosed herein relate to fanout optimization during physical synthesis for placed circuit designs to be implemented within integrated circuits. One embodiment of the present invention can include a method of processing a circuit design for a target device. The method can include assigning load pins of a high fanout (HF) signal of a placed circuit design into a plurality of windows according to a location of each of the load pins on the target device and replicating a source of the HF signal, wherein each window is associated with a source of the HF signal. For each source of the HF signal, the source can be connected to load pins of the window associated with the source and the source can be placed within the window associated with the source. The placed circuit design can be output.

Assigning load pins can include defining an initial window that encompasses each of the load pins subdividing the initial window into the plurality of windows. Each of the plurality of windows can include a number of load pins that does not exceed a window maximum threshold. The method can include deleting each window of the plurality of windows that includes no load pins of the high fanout signal. For example, each of the plurality of windows can be include at least one load pin.

Placing the source can include calculating a center of gravity for each window and, for each window, locating the source associated with the window at a location corresponding to the center of gravity of the window. In another embodiment, placing the source can include, for each window, locating the source associated with the window at a location within the window determined using a selected source location technique.

Another embodiment of the present invention can include method of processing a circuit design for a target device. The method can include defining a window surrounding each load pin of an HF signal within a placed circuit design on the target device, wherein each window comprises one of the load pins. Regions of the intersecting windows can be identified. A source of the HF net can be replicated for selected regions, wherein a source is associated with each selected region. For each source of the HF signal, the source can be connected to load pins within each window that intersects to form the selected region associated with the source and the source can be placed within the selected region associated with the source. The placed circuit design can be output.

Defining a window can include, for each window, calculating at least one of a length or a width of the window according to a timing requirement of the load pin within the window. Defining a window also can include sizing each of the plurality of windows, wherein, for each window, a maximum delay from a perimeter of the window to the load pin within the window does not exceed a timing requirement for the load pin.

The method also can include selecting regions into which the source is to be replicated and placed. Selecting regions can include defining each selected region as an intersection of at least two windows, wherein each window, in combination with at least one other window, defines one selected region. Selecting regions also can include designating a window as a selected region, wherein the source associated with the window is connected to the load pins of the window.

Another embodiment of the present invention can include a computer program product including a computer-usable medium having computer-usable program code that processes a circuit design for a target device. The computer-usable medium can include computer-usable program code that assigns load pins of an HF signal of a placed circuit design into a plurality of windows, wherein the plurality of windows defines a plurality of regions. The computer-usable medium further can include computer-usable program code that replicates a source of the HF signal, wherein each region is associated with a source of the HF signal. The computer-usable medium also can include computer-usable program code that, for each source of the HF signal, connects the source to load pins according to the region associated with the source and places the source within the region associated with the source. Computer-usable program code that outputs the placed circuit design further can be included.

The computer-usable program code that assigns load pins can include computer-usable program code that defines the plurality of windows, wherein each window of the plurality of windows includes one load pin, computer-usable program code that identifies intersections of windows of the plurality of windows, and computer-usable program code that designates selected intersections as regions, wherein each load of a window that intersects to form a region is associated with the region. The computer-usable program code that designates selected intersections as regions can include computer-usable program code that defines each region to be an intersection of at least two windows, wherein each window, in combination with at least one other window, defines one selected region. In another embodiment, the computer-usable medium can include computer-usable program code that designates a window as a selected region, wherein the source associated with the window is connected to the load pins of the window.

The computer-usable program code that defines a window can include computer-usable program code that, for each window, calculates at least one of a length or a width of the window according to a timing requirement of the load pin within the window. The computer-usable program code that defines a window also can include computer-usable program code that sizes each of the plurality of windows, wherein a maximum delay from a perimeter of the window to the load pin within the window does not exceed a timing requirement for the load pin.

The computer-usable program code that places the source further can include computer-usable program code that, for each source of the high fanout signal, assigns the source to a location within the region associated with the source.

The computer-usable program code that assigns load pins can include computer-usable program code that defines an initial window that encompasses each of the load pins and computer-usable program code that subdivides the initial window into the plurality of windows, wherein each of the plurality of windows includes a number of load pins that does not exceed a window maximum threshold, and each of the plurality of windows is a region.

The computer-usable medium further can include computer-usable program code that deletes each window of the plurality of windows that includes no load pins of the high fanout signal. For example, each of the plurality of windows can include at least one load pin.

The computer-usable program code that places can include computer-usable program code that calculates a center of gravity for each region and computer-usable program code that, for each region, locates the source associated with the region at a location corresponding to the center of gravity of the region. The computer-usable program code that places the source further can include, for each region, locating the source associated with the region at a location within the region determined using a selected source location technique.

DETAILED DESCRIPTION OF THE DRAWINGS

While the specification concludes with claims defining the features of the invention that are regarded as novel, it is believed that the invention will be better understood from a consideration of the description in conjunction with the drawings. As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting but rather to provide an understandable description of the invention.

The embodiments disclosed herein relate to optimizing high fanout (HF) nets and/or HF signals of a circuit design during physical synthesis. An HF net, as used herein, can refer to any network in which a signal from a same source is provided to a plurality of load pins. In some cases, an HF threshold can be applied such that any signal from a single source or driver that is provided to a number of load pins that exceeds a predetermined number of load pins, e.g., the HF threshold, can be considered an HF net. A signal from a single source that is distributed to a number of load pins exceeding the HF threshold can be referred to as an "HF signal."

Typically, an HF signal will be provided to anywhere from tens of load pins to hundreds of load pins. It should be appreciated, however, that these are examples and, as such, are not intended to limit the size of an HF net or signal in terms of a lower limit or an upper limit. In other cases, a circuit designer can designate a net or signal as an HF net or HF signal through the association of one or more properties within a programmatic circuit description.

In accordance with the embodiments disclosed herein, an HF net and/or signal within a placed circuit design can be selected for optimization. Load pins of the HF signal, or net, can be clustered according to any of a variety of different clustering techniques. Based upon the results of the clustering, the source of the HF signal can be replicated within the circuit design so that each cluster is associated with a source. Each source then can be located proximate to the various clusters of load pins associated with that source. The HF net can be connected so that each source drives the load pins of the cluster with which it is associated.

Figure 1:
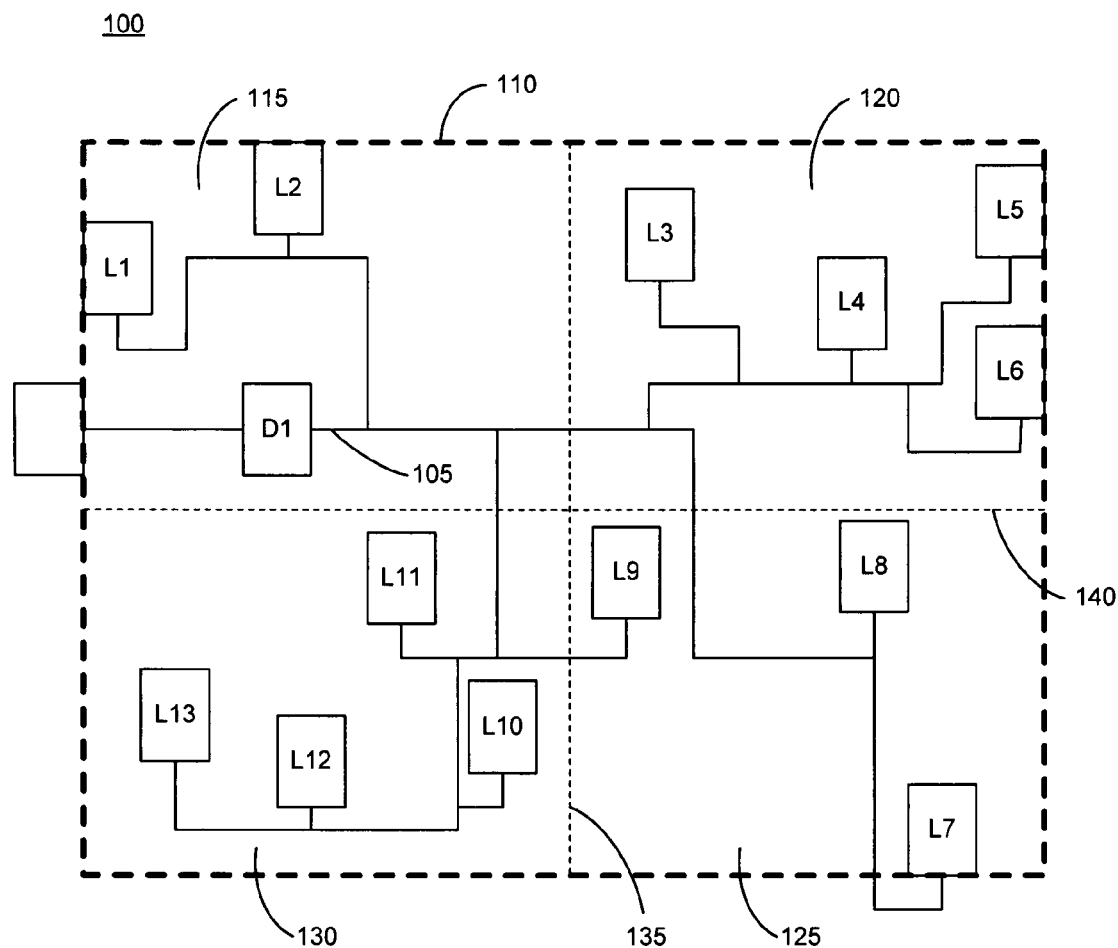
FIG. 1 is a block diagram illustrating a high fanout (HF) net of a circuit design in accordance with one embodiment of the present invention.

FIG. 1 is a block diagram illustrating an HF net 100 of a circuit design in accordance with one embodiment of the present invention. The HF net 100 can be specified as part of a circuit design that is to be implemented within an integrated circuit (IC). One type of IC with which the embodiments disclosed herein can be used is a programmable logic device (PLD).

As is well known, PLDs are a type of IC that can be programmed to perform specified logic functions. One type of PLD, the field programmable gate array (FPGA), typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and other components.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

While PLDs and FPGAs are used as examples of ICs with which the embodiments disclosed herein can be used, such examples are not intended to limit the embodiments disclosed herein. Embodiments and/or aspects of the present invention may be applied to other varieties of ICs.

Continuing with FIG. 1, the circuit design can be a placed circuit design. Accordingly, the HF net 100, being part of the circuit design, can be placed. Each element of the HF net 100 can be assigned a location on the target device. As shown, a signal 105 is output from a source, or driver, D1. Signal 105, which in this example is an HF signal, is provided to each of load pins L1-L13.

After identification of an HF signal such as signal 105, a rectangular window 110 can be determined. The rectangular window 110, like other windows to be described herein, can be overlaid upon a representation of the physical target device that takes into account the locations to which the elements of the circuit design have been placed. In one embodiment, a length and/or a width of the window 110 can be calculated such that the size of the window 110 is the smallest rectangular window that can be generated that still encompasses each of the load pins L1-L13 of the HF signal 105.

The load pins L1-L13 can be binned into a plurality of clusters according to the location to which each respective load pin is assigned on the target device. Load pins effectively can be assigned to different windows. One technique for binning the load pins L1-L13 involves subdividing window 110. As shown, window 110 can be subdivided into a plurality of windows 115, 120, 125, and 130. Window 110 can be subdivided into smaller windows, or sub-windows, as shown using dividing lines 135 and 140. For example, each of dividing lines 135 and 140 can subdivide window 110 in half. It should be appreciated, however, that it is not necessary that a window be divided into equal halves. Further subdivisions of windows 110, 115, 120, 125, and/or 130 can be made if so desired.

In one embodiment, window 110 can be continually subdivided until each resulting window, e.g., windows 115, 120, 125, and 130, encompasses a number of load pins of the HF signal 105, forming a cluster of load pins, which does not exceed a maximum number of load pins. This maximum number of load pins for a window can be referred to as the window maximum threshold. In the example pictured in FIG. 1, the window maximum threshold can be selected to be four.

Accordingly, window 110 can be recursively subdivided until each resulting window, e.g., windows 105-130, has no more than four load pins of the HF signal 105. Each cluster has no more than four load pins. The window maximum threshold can be raised or lowered as may be required.

It should be appreciated that windows can be recursively subdivided until the number of load pins within each window conforms to the established limit. The subdivision process, however, need not continually divide only window 110 into smaller windows or halves. Rather, any of the windows can be divided without division of other windows. For example, if the threshold is set at three load pins, windows 120 and 130 can be divided without further dividing windows 115 or 125. Also, each window need not have the same number of load pins. Each window can have a number of load pins that does not exceed the threshold. If one or more windows are generated that include no load pins, such windows can be discarded or otherwise ignored in terms of source replication and the various processing steps and/or techniques described herein.

Figure 2:
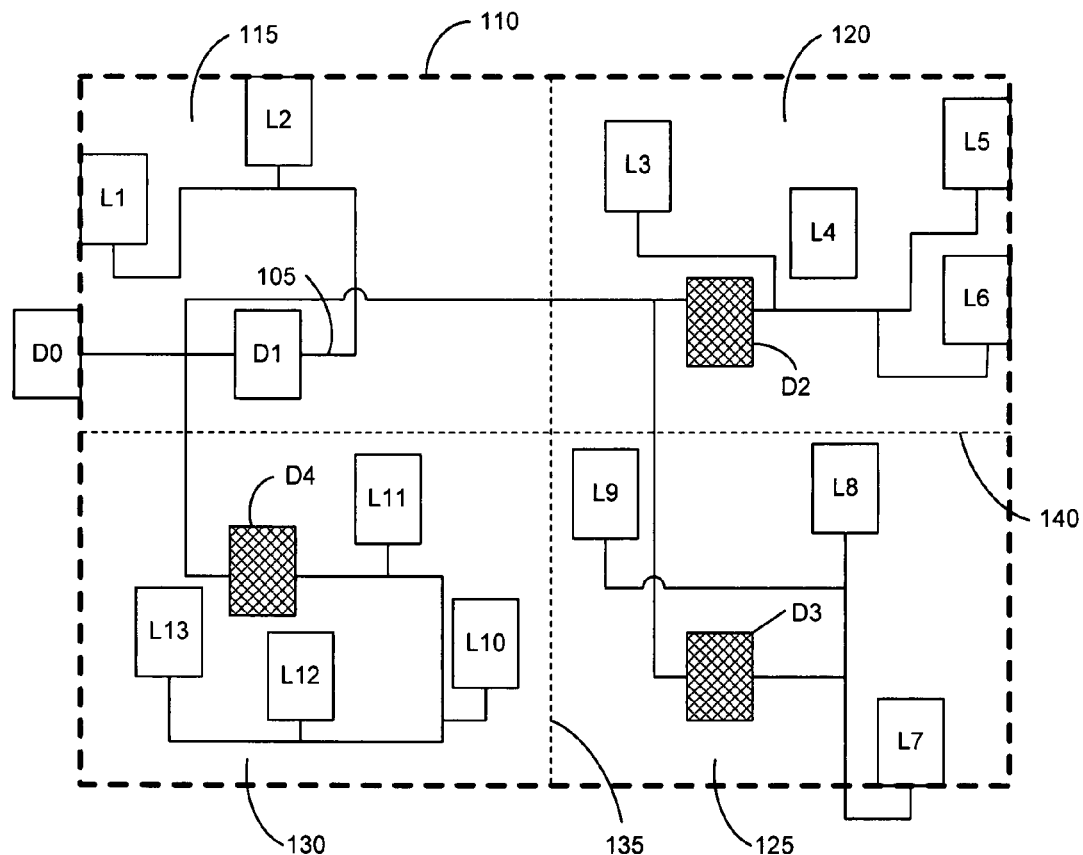
FIG. 2 is a block diagram illustrating the HF net of FIG. 1 in accordance with another embodiment of the present invention.

FIG. 2 is a block diagram illustrating the HF net 100 of FIG. 1 in accordance with another embodiment of the present invention. FIG. 2 illustrates a next processing step in optimizing HF nets such as HF net 100. As shown, the source D1 has been replicated so that one source exists, or is associated with, each of the windows 115-130. As noted, if any windows are formed that include no load pins, such windows can be purged or deleted such that each remaining window is associated with a source as described herein. In the example of FIG. 2, as four windows exist, the source D1 is replicated three times, or "N−1" times, where N is the number of windows (or remaining windows) as well as the resulting number of sources. Sources with cross-hatching, labeled as D2, D3, and D4, represent replicated versions of source D1.

After replicating source D1, the HF net 100 can be connected so that each load pin in a window receives the HF signal 105 from the source that is associated with that window. For example, with respect to window 115, the connections can remain or be reformed so that load pins L1 and L2 receive the HF signal 105 from source D1, which is the original source in this case. Load pins L3, L4, L5, and L6 within window 120 can be connected so that each receives the HF signal 105 from replicated source D2. Load pins L7, L8, and L9 within window 125 can be connected so that each receives the HF signal 105 from replicated source D3. Load pins L10, L11, L12, and L13 within window 130 can be connected so that each receives the HF signal 105 from replicated source D4. The connections, or wiring, discussed with reference to FIG. 2 refer to logical connectivity as the replicated sources D2, D3, and D4 have not yet been placed and the circuit design has not yet been routed.

In cases where the source D1 is not located within any window, the source D1 can be relocated into a window such that the number of windows N is equal to the number of sources inclusive of both replicated sources, e.g., D2, D3, and D4, as well as the original source, e.g., D1. In another embodiment, the original source D1 can be replicated N times, e.g., one time for each window. In that case, the original source D1 can be deleted, leaving only replicated versions of the original source D1.

In one embodiment, the replicated sources D2-D4 can be assigned to an available location within the window to which each such source is associated. In another embodiment, a center of gravity (CG) can be calculated for each of the windows. In that case, the replicated source can be placed at a location corresponding to the CG. For example, the source can be located at the CG for the associated window or near the CG, for example, using a nearest neighborhood placement technique to locate an available site proximate to the CG.

The CG of a window can be calculated according to the placement of the load pins contained within that window and reflect the connectivity of the entire block. For example, the CG of a window can reflect the connectivity and timing criticality of each respective load pin in the window as determined or measured from the source that drives the original source D1, e.g., in this case D0. The circuit design can be viewed as a grid overlaid upon the physical target device. The CG can be calculated for both the x-coordinate and the y-coordinate independently. The x-coordinate of the CG for a given window, denoted as $CG_x$, can be calculated according to $CG_x = w_1 x_1 + w_2 x_2 + \ldots w_n x_n$, where $x_n$ represents the x-coordinate of each respective load pin $L_n$ within the window and $w_n$ represents the timing weight of each respective load pin $L_n$ within the window.

More particularly, the timing weight $w_n$ can reflect the timing criticality of the load under question with respect to the load having the worst timing characteristics within the window, e.g., worst slack, as a means of biasing so that the source is placed near the more, or the most, timing critical load pins. As is well known, "slack" refers to the difference between the timing requirement of a signal and an estimate of the propagation time for that signal. A negative slack indicates a timing critical signal, e.g., one that is not meeting the established timing requirement. A positive slack indicates a signal that is exceeding a timing requirement. A slack of zero indicates a signal that is exactly meeting its timing requirement. The CG equation can reflect the connectivity of the entire block, including the connectivity of each respective load pin as determined or measured from the source that drives the original source D1, e.g., in this case D0. The y-coordinate of the CG for a window, denoted as $CG_y$, can be computed in similar fashion. For example, the $CG_y$ can be calculated according to $CG_y = w_1 y_1 + w_2 y_2 + \ldots w_n y_n$. The CG calculation technique disclosed herein results in locating the source, whether a replicated source or a relocation of the source, in a window at a location that will be closer to more timing critical load pins and farther from load pins that are less critical in terms of timing.

In illustration, the location of the CG for window 125 can be calculated. The replicated source D3 is associated with window 125. The replicated source D3 can be located at a site of the target device that is at, near, or nearest to the location of the CG for window 125. For example, a nearest neighborhood placement technique can be used to locate an available site at or near the CG. It should be appreciated that any of a variety of known placement techniques further can be applied to select a particular location for the source within a given window. For example, factors such as routability, congestion, power consumption, and the like can be considered when selecting a location to place a source within the window associated with that source.

After the source D1 is replicated, connected, and placed, the circuit design can be further processed. For example, further optimizations can be applied. The circuit also can be routed. The resulting circuit design can be output or transformed into a bitstream that, when loaded into a target device such as an FPGA, programs the FPGA to implement the circuit design.

Figure 3:
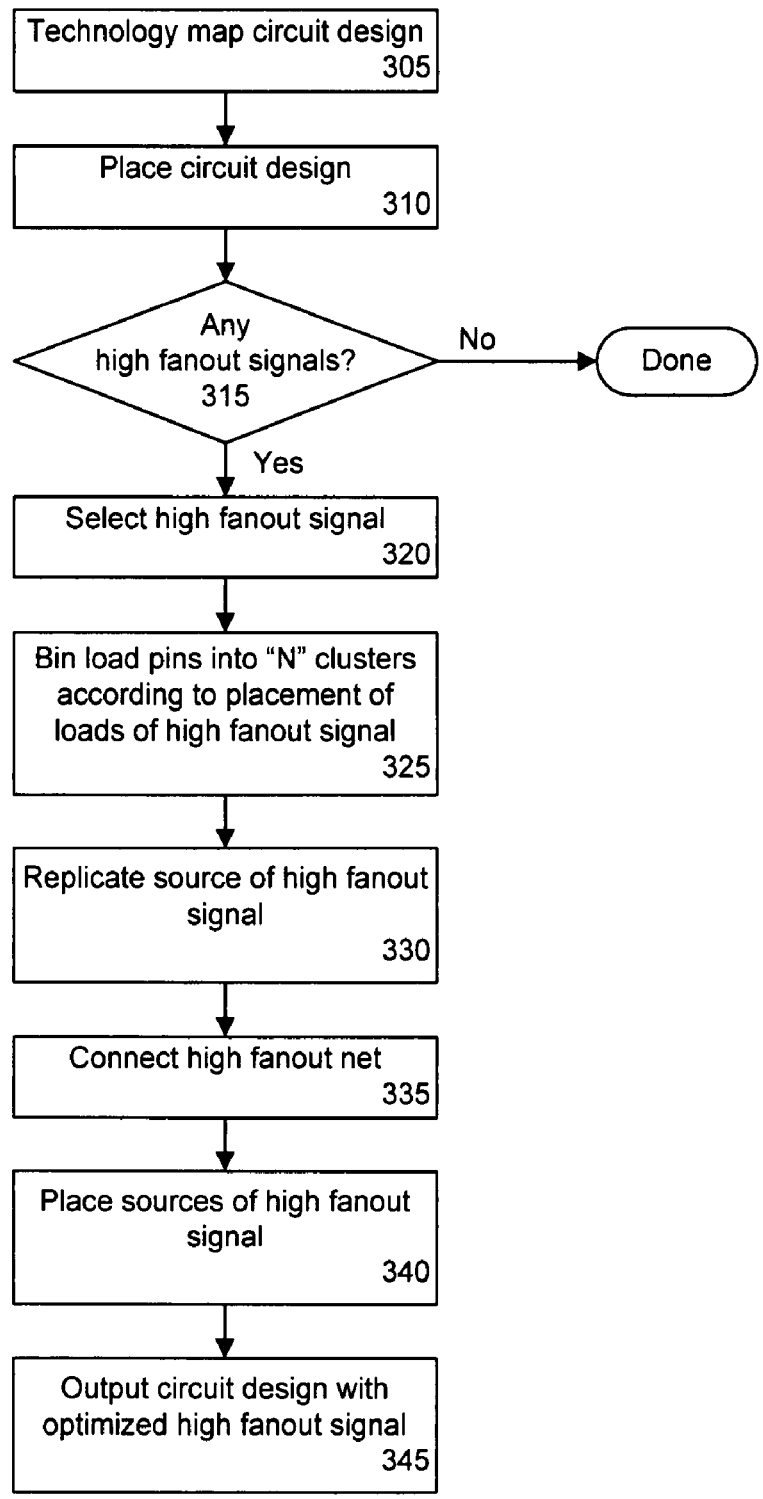
FIG. 3 is a flow chart illustrating a method of optimizing an HF net in accordance with another embodiment of the present invention.

FIG. 3 is a flow chart illustrating a method 300 of optimizing an HF net in accordance with another embodiment of the present invention. The method 300 can begin in a state in which a programmatic description of a circuit design has been loaded into an EDA tool and, if specified in a hardware description language (HDL), the circuit design can be transformed into a gate level description.

In step 305, the circuit design can be technology mapped. The various elements of the circuit design can be assigned to specific structures or circuit components of the target device. In step 310, the circuit design can be placed. Each of the elements of the circuit design can be assigned to locations on the target device.

In step 315, a determination can be made as to whether an HF signal exists within the circuit design. In one embodiment, HF signals can be automatically identified by the EDA tool by evaluating signals of the circuit design and identifying any signal that is provided from a single source to a number of load pins that exceeds a predetermined HF threshold number of load pins. In another embodiment, an HF signal can be designated as such through incorporation of a property or attribute into the circuit description. If one or more HF signals are identified, the method can proceed to step 320. If not, the method can end. That is, the optimization process for HF nets can end but further processing upon the circuit design for implementation within the target device can proceed, e.g., routing and the like.

Continuing with step 320, an HF signal can be selected for optimization. In step 325, the load pins of the selected HF signal can be binned into "N" different clusters. As discussed, the binning process can include creating a window that encompasses all of the load pins of the HF signal. The window can be recursively divided into a plurality of windows, or sub-windows, until each resulting window encompasses and defines a cluster of load pins. The number of load pins in each cluster, and thus window, does not exceed the window maximum threshold.

In step 330, the source can be replicated so that each of the "N" clusters, in this case corresponding to windows, is associated with a source of the HF signal. The associated source for a cluster or window, as the case may be, may be either the original source or a replicated version of the source. In this sense, "replicating" can refer to replicating the source N−1 times and retaining the original source, replicating the source N times and purging the original source, or replicating the original source N−1 times and relocating the original source. In step 335, the HF net can be connected, or wired, so that the load pins in each window are driven by the source that has been associated with that window. In step 340, each source can be placed to a location within the particular window with which that source has been associated. Each source can be placed according to a selected placement technique. It should be appreciated that the original source need not be moved or re-placed, but may be if so desired. In step 345, the resulting circuit design specifying the optimized HF net and HF signal can be output.

The circuit design can be processed further, e.g., routed, further optimized, and/or translated into a bitstream. It should be appreciated that while the method 300 has been described with reference to processing a single HF net, the method 300 can be repeated as may be required to process further HF signals and/or nets of the circuit design.

Figure 4:
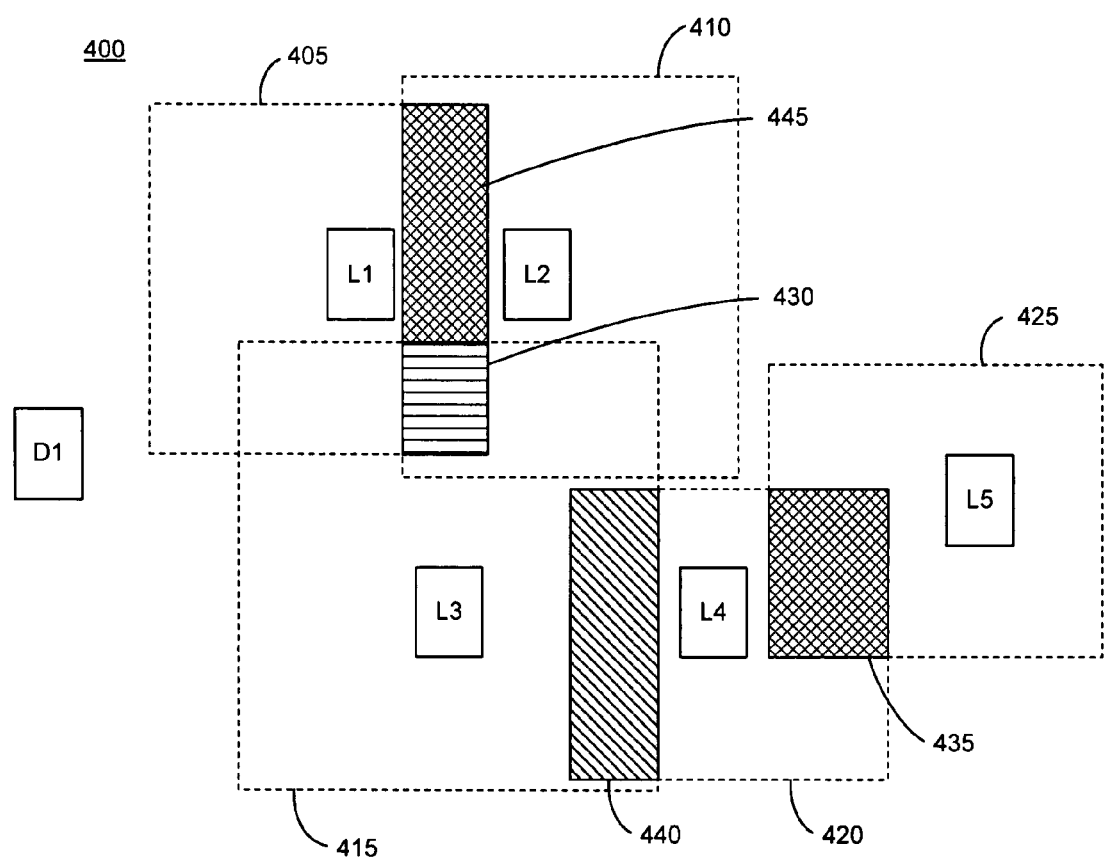
FIG. 4 is a block diagram illustrating an HF net in accordance with another embodiment of the present invention.

FIG. 4 is a block diagram illustrating an HF net 400 in accordance with another embodiment of the present invention. For purposes of illustration and clarity, connectivity of the HF net 400 is not shown. The HF net 400 includes a source D1 and a plurality of load pins L1, L2, L3, L4, and L5, each receiving a signal from source D1. In the embodiment pictured in FIG. 4, a window is defined for each of the load pins L1-L5. As shown, window 405 is defined for load pin L1, window 410 is defined for load pin L2, window 415 is defined for load pin L3, window 420 is defined for load pin L4, and window 425 is defined for load pin L5.

The length and/or width of each of the windows 405-425 can be determined according to timing requirements for the particular load pin that each window encompasses. For example, if a timing requirement of load pin L1 is 2 ns, and the current placement of the source with respect to load pin L1 results in an estimated delay of 3 ns, a slack of −1 exists for that connection. Window 405 can be sized so that the maximum delay that would result if source D1 were located within the window 405 would be 2 ns.

On devices such as FPGAs, which have a grid-like architecture, such relations between timing and distance on the IC can be established. For example, a distance to delay index can be determined that can be specified in terms of columns, rows, type of physical wiring resource needed or used for the connection, and the type of elements being connected. With such data available, the size of a window in terms of the maximum horizontal and/or vertical distance from the load pin can be determined. For example, if the maximum horizontal distance from load pin L1 is dx, the resulting rectangle can have a horizontal measurement of 2x, where the rectangle can extend outward from the load pin L2 a distance of 1x in each horizontal direction.

After calculating the window for each load pin L1-L5, intersections, e.g., overlaps, of the windows can be identified. For example, the intersection of windows 405, 410, and 415 is depicted as region 430. The intersection of windows 405 and 410 is depicted as region 445. Similarly, the intersection of window 420 and window 425 is depicted as region 435. In one example, regions 430 and 435 can be identified as selected regions in that a source located within region 430 will satisfy timing requirements for each of load pins L1, L2, and L3. A source located within region 435 will satisfy the timing requirements of load pin L4 and L5. Each of the load pins L1-L5 can be serviced by replicating a source within region 430 and 435. Other regions of overlapping windows can be designated as selected regions as described herein.

The source D1 can be replicated for each selected region, e.g., in this illustration regions 430 and 435. A replicated version of the source can be created for each region 430 and 435, such that each region 430 and 435 is associated with one source. The original source D1 can be purged. In another embodiment, the original source D1 can be relocated so that source D1 need only be replicated one time. The HF net 400 can be connected such that each load pin of a window that defines a selected region receives an input signal, or is driven by, the source associated with that selected region. For example, the source D1 can be replicated and associated with region 430. The HF net 400 can be connected such that load pins L1, L2, and L3 are driven by the source associated with selected region 430. Further, the HF net 400 can be connected such that load pins L4 and L5 are driven by the source associated with selected region 435.

Each replicated source can be located, or placed, at an available site within the selected region associated with that source. For example, the source associated with region 430 can be placed at an available location within region 430. It should be appreciated that any of a variety of known placement techniques further can be applied to select a particular location for the source within a given region. For example, factors such as routability, congestion, power consumption, and the like can be considered in choosing a location for the source within each selected region.

In one embodiment, regions of overlapping or intersecting windows can be selected such that each selected region is defined as an intersection of two or more windows and each window encompassing a load pin, in combination with at least one other window, defines only one selected region. In another embodiment, a selected region can be a single window including a load pin, e.g., where a determination is made to place a source near a particular load pin and the source is not shared with any other load pins of the HF signal.

In any case, only selected regions can be associated with sources of the HF signal and define an area within which a source of the HF signal will be located. For example, if a source were located in the overlapping region of windows 415 and 420, denoted as overlap 440, window 425 of load pin L5 would not define any selected region in terms of window overlap. Window 420 would be unavailable to form other selected regions. The entirety of window 425, however, can be designated as a selected region.

Figure 5:
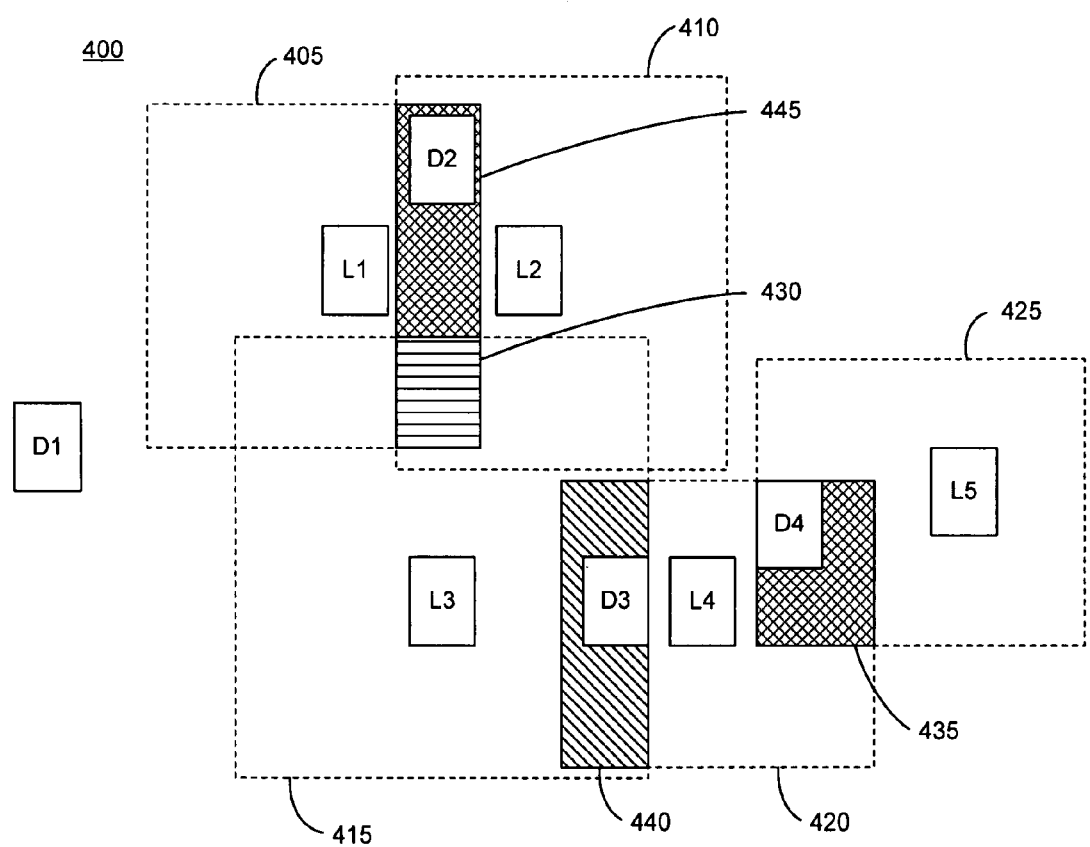
FIG. 5 is a block diagram illustrating the HF net of FIG. 4 in accordance with another embodiment of the present invention.

FIG. 5 is a block diagram illustrating the HF net 400 in accordance with another embodiment of the present invention. As shown, source D1 has been replicated as represented by sources D2, D3, and D4. It should be appreciated that the source D1 can be deleted once replicated as shown. In another embodiment, the source D1 can be moved, e.g., to the location corresponding to D2, D3, or D4. Where N selected regions are determined, as noted, "replicating" can include, but is not limited to, replicating the source N−1 times and retaining the original source, replicating the source N−1 times and relocating the original source, or replicating the source N times and purging the original source.

From a review of FIG. 5, it can be seen that source D2 can drive load pins L1, L2, and L3 if placed within region 430. If placed within region 445, source D2 can drive load pins L1 and L2. Source D3 can drive load pins L3 and L4. Source D4 can drive load pin L4 and L5. Accordingly, a determination must be made as to whether load pin L3 will be grouped with load pins L1 and L2, be independent, or be grouped with load pin L4. Similarly, a determination must be made as to whether load pin L4 will be driven by source D3 or source D4. If, for example, load pin L4 is driven by source D3, then source D4 is no longer constrained to being located within region 435. Source D4 can be located anywhere within window 425. In that case, window 425 would be considered a selected region.

In one embodiment, fanout balancing can be used to determine which load pins will be driven by a given source. A maximum fanout can be set which can limit the number of load pins that will be driven by the source, whether replicated or a relocated version of the original source. For example, a maximum fanout of two can be established. If source D2 drives load pins L1 and L2, the fanout of source D2 is two. If source D3 drives load pins L3 and L4, source D3 also has a fanout of two. Load pin L5 can be driven by source D4, which will have a fanout of one, which is less than the established maximum. Such a maximum fanout would prevent source D2 from driving load pins L1, L2, and L3.

It should be appreciated that if source D2 drives only load pins L1 and L2, then source D2 can be placed anywhere within the intersection of windows 405 and 410, e.g., within region 445. In other words, the selected region for source D2 can be the intersection of windows 405 and 410 as source D2 is not constrained to being located within region 430 since load pin L3 is driven by a different source.

In another embodiment, if device resources are sufficiently available, e.g., congestion is not too high, then minimization of timing can be used and windows can be minimized in terms of size. In such an embodiment, the source will be replicated more times resulting in increased device resource usage. In still another embodiment, if congestion is above a threshold, the replication of sources may be minimized. In that case, the regions with the largest number of overlapping windows can be designated as selected regions. In that case, for example, each source would drive as many load pins as possible considering window overlap. In such an embodiment, resource usage on the target device would be minimized as fewer sources likely would be replicated.

In some cases, a selected region may not have any available sites for accommodating a source. In such cases, each overlapping window defining a region that has no available sites can be designated as a selected region. For example, if region 430 has no available sites, a source can be associated with each of windows 405 and 410. The source for window 405, for instance, can be placed anywhere within window 405. Similarly, the source for window 410 can be placed anywhere within window 410.

For purposes of illustration, source D2 can be placed within region 445 to drive load pins L1 and L2. Source D3 can be placed within region 440 to drive load pins L3 and L4. Source D4 can be placed within region 435 to drive load pin L5.

Figure 6:
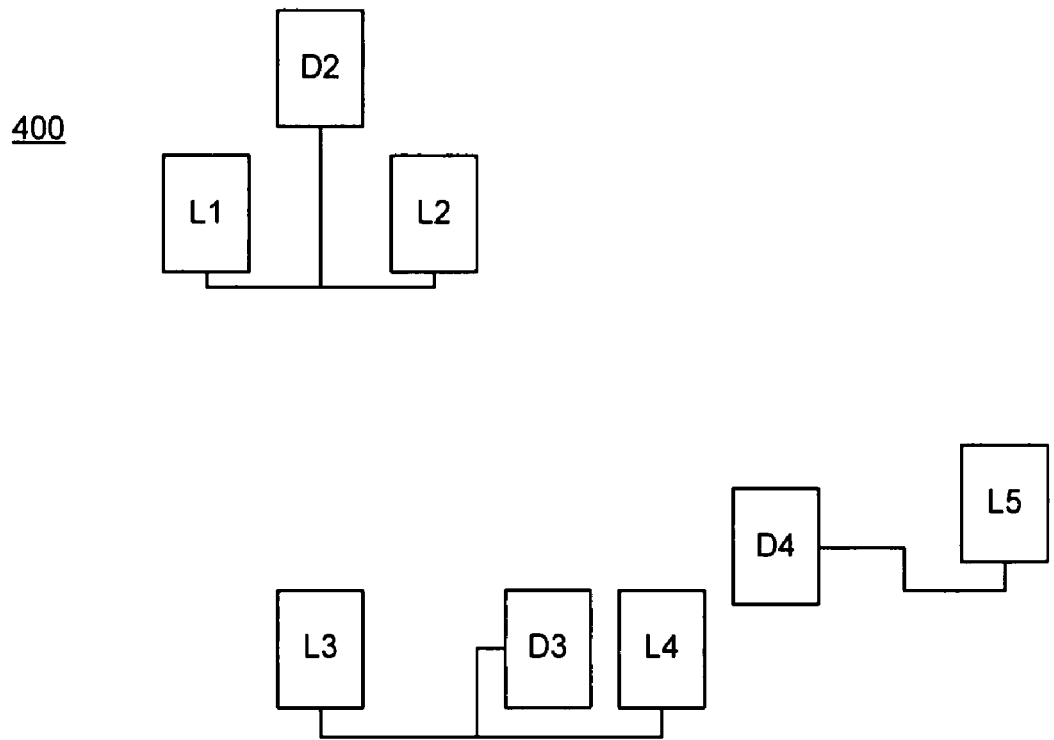
FIG. 6 is a block diagram illustrating the HF net of FIG. 4 in accordance with another embodiment of the present invention.

FIG. 6 is a block diagram illustrating the HF net of FIG. 4 in accordance with another embodiment of the present invention. FIG. 6 illustrates the connectivity and routing that can be implemented once the source is replicated as described with reference to FIG. 5, e.g., where source D2 drives load pins L1 and L2, source D3 drives load pins L3 and L4, and source D4 drives load pin L5. In the example pictured in FIG. 6, the original source D1 of FIGS. 4 and 5 has been deleted, e.g., rather than being moved. It should be appreciated that in an alternate embodiment, the original source can be moved to act as either source D2, D3, or D4. In that case, fewer replicated sources would be needed. As shown, source D2 has been routed to drive load pins L1 and L2. Source D3 has been routed to drive load pins L3 and L4. Source D4 has been placed to drive load pin L5.

Figure 7:
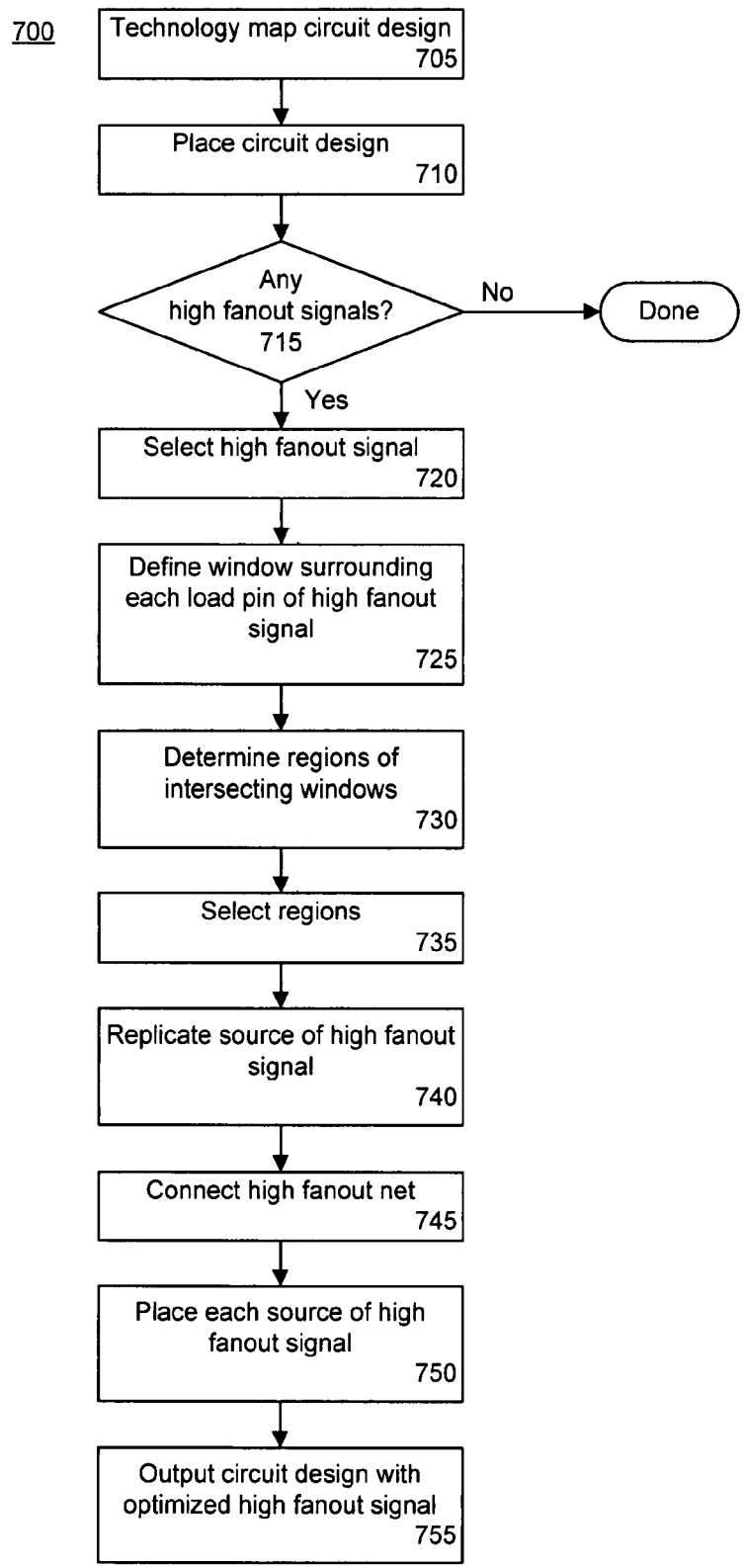
FIG. 7 is a flow chart illustrating a method of optimizing an HF net in accordance with another embodiment of the present invention.

FIG. 7 is a flow chart illustrating a method 700 of optimizing an HF net in accordance with another embodiment of the present invention. The method 700 can begin in a state in which a programmatic description of a circuit design has been loaded into an EDA tool and, if specified in an HDL, the circuit design can be transformed into a gate level description.

In step 705, the circuit design can be technology mapped. In step 710, the circuit design can be placed with respect to the target device. In step 715, the EDA tool can determine whether any HF signals exist in the circuit design. If so, the method can proceed to step 720. If not, the method, at least in terms of HF net optimization, can end.

Continuing with step 720, an HF signal can be selected for optimization. In step 725, a window can be defined for each load pin of the HF signal such that each window encompasses a load pin. The length and/or width of each window can be determined according to timing requirements of the load pin encompassed by the window. In step 730, the regions of intersecting windows can be determined or identified. In step 735, one or more regions can be selected into which the source of the HF signal will be replicated. As noted, regions of overlapping or intersecting windows can be selected such that each selected region is defined by two or more windows and each window of a load pin, in combination with at least one other window, defines one selected region. In other cases, one or more individual windows can be designated as a selected region. Such a determination can be made according to the selected technique for determining the number of sources to be used.

In step 740, the source of the HF signal can be replicated so that each region is associated with one source of the HF signal. As noted, where N selected regions are determined, "replicating" can include, but is not limited to, replicating the source N−1 times and retaining the original source, replicating the source N−1 times and relocating the original source, or replicating the source N times and purging the original source. In step 745, the HF net can be connected such that each load pin in a window that defines a region receives signal, or is driven by, the source associated with that region. In step 750, each source of the HF signal can be placed within the selected region associated with that source. In step 755, the circuit design specifying the optimized HF signal can be output.

The circuit design can be processed further as may be required, e.g., in terms of routing, further optimizations, and/or translation into a bitstream. It should be appreciated that while the method 700 has been described with reference to processing a single HF net, the method 700 can be repeated as may be required to process further HF signals and/or nets of the circuit design.

The embodiments disclosed herein have been discussed largely in the context of being applied post-placement. While the embodiments also have been described as taking place prior to routing, it should be appreciated that the embodiments disclosed herein also can be applied at routing or post routing. In such cases, any routed connections can be "ripped up" and re-routed as may be required according to the connectivity determined when the source of an HF signal is replicated and placed as discussed herein.

The flowcharts in the figures illustrate the architecture, functionality, and operation of possible implementations of systems, methods and computer program products according to various embodiments of the present invention. In this regard, each block in the flowcharts may represent a module, segment, or portion of code, which comprises one or more portions of computer-usable program code that implements the specified logical function(s).

It should be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It also should be noted that each block of the flowchart illustrations, and combinations of blocks in the flowchart illustrations, can be implemented by special purpose hardware-based systems that perform the specified functions or acts, or combinations of special purpose hardware and computer instructions.

Embodiments of the present invention can be realized in hardware, software, or a combination of hardware and software. The embodiments can be realized in a centralized fashion in one computer system or in a distributed fashion where different elements are spread across several interconnected computer systems. Any kind of computer system or other apparatus adapted for carrying out the methods described herein is suited. A typical combination of hardware and software can be a general-purpose computer system with a computer program that, when being loaded and executed, controls the computer system such that it carries out the methods described herein.

Embodiments of the present invention further can be embedded in a computer program product, which comprises all the features enabling the implementation of the methods described herein. The computer program product can include a computer-usable or computer-readable medium having computer-usable program code which, when loaded in a computer system, causes the computer system to perform the functions described herein. Examples of computer-usable or computer-readable media can include, but are not limited to, optical media, magnetic media, computer memory, one or more portions of a wired or wireless network through which computer-usable program code can be propagated, or the like.

The terms "computer program," "software," "application," "computer-usable program code," variants and/or combinations thereof, in the present context, mean any expression, in any language, code or notation, of a set of instructions intended to cause a system having an information processing capability to perform a particular function either directly or after either or both of the following: a) conversion to another language, code or notation; b) reproduction in a different material form. For example, a computer program can include, but is not limited to, a subroutine, a function, a procedure, an object method, an object implementation, an executable application, an applet, a servlet, a source code, an object code, a shared library/dynamic load library and/or other sequence of instructions designed for execution on a computer system.

The terms "a" and "an," as used herein, are defined as one or more than one. The term "plurality," as used herein, is defined as two or more than two. The term "another," as used herein, is defined as at least a second or more. The terms "including" and/or "having," as used herein, are defined as comprising, i.e., open language. The term "coupled," as used herein, is defined as connected, although not necessarily directly, and not necessarily mechanically, e.g., communicatively linked through a communication channel or pathway or another component or system.

The embodiments disclosed herein can be embodied in other forms without departing from the spirit or essential attributes thereof. Accordingly, reference should be made to the following claims, rather than to the foregoing specification, as indicating the scope of the various embodiments of the present invention.

What is claimed is:

1. A method of processing a high fanout signal defined by a source coupled to a plurality of load pins within a circuit design for a target device, the method comprising:
   determining, via a computer, a plurality of windows encompassing load pins of a high fanout signal of a placed circuit design according to a location of each of the load pins of the high fanout signal on the target device;
   wherein each of the plurality of windows includes a respective subset of the plurality of load pins of the high fanout signal, and one or more of the subsets includes two or more of the load pins;
   replicating, via the computer, a source of the high fanout signal resulting in a plurality of sources, wherein each window is associated with one of the plurality of sources of the high fanout signal;
   via the computer, for each source of the high fanout signal,
      connecting the source to the load pins of the window associated with the source; and
      placing the source within the window associated with the source; and
   outputting the placed circuit design.

2. The method of claim 1, wherein the determining comprises:
   defining an initial window that encompasses all of the load pins; and
   subdividing the initial window into the plurality of windows, wherein each of the plurality of windows encompasses a number of the load pins that does not exceed a window maximum threshold.

3. The method of claim 1, further comprising deleting each window of the plurality of windows that comprises no load pins of the high fanout signal.

4. The method of claim 1, wherein the placing comprises:
   calculating a center of gravity for each window; and
   for each window, locating the source associated with the window at a location corresponding to the center of gravity of the window.

5. The method of claim 1, wherein the placing comprises, for each window, locating the source associated with the window at a location within the window determined using a selected source location technique.

6. A computer program product, comprising:
   a non-transitory computer-usable medium storing computer-usable program code that processes a high fanout signal defined by a source coupled to a plurality of load pins within a circuit design for a target device, the computer-usable medium comprising:
   computer-usable program code that determines a plurality of windows encompassing load pins of a high fanout signal of a placed circuit design;
   wherein each of the plurality of windows includes a respective subset of the plurality of load pins of the high fanout signal, and one or more of the respective subsets includes two or more of the load pins;
   computer-usable program code that replicates a source of the high fanout signal resulting in a plurality of sources, wherein each window is associated with one of the plurality of sources of the high fanout signal;
   computer-usable program code that, for each source of the high fanout signal,
      connects the source to load pins according to the window associated with the source;
      places the source within the window associated with the source;
   computer-usable program code that outputs the placed circuit design.

7. The computer program product of claim 6, wherein the computer-usable program code that determines the plurality of windows further comprises:
   computer-usable program code that defines an initial window that encompasses all of the load pins; and
   computer-usable program code that subdivides the initial window into the plurality of windows, wherein each of the plurality of windows comprises a number of load pins that does not exceed a window maximum threshold.

8. The computer program product of claim 7, wherein the computer-usable medium further comprises computer-usable program code that deletes each window of the plurality of windows that comprises no load pins of the high fanout signal.

9. The computer program product of claim 7, wherein the computer-usable program code that places further comprises:
   computer-usable program code that calculates a center of gravity for each window; and
   computer-usable program code that, for each window, locates the source associated with the window at a location corresponding to the center of gravity of the window.

10. A system for processing a high fanout signal defined by a source coupled to a plurality of load pins within a circuit design for a target device, comprising:
    a computer system configured with a program that when executed, causes the computer system to perform operations including:
       determining, via a computer, a plurality of windows encompassing load pins of a high fanout signal of a placed circuit design according to a location of each of the load pins of the high fanout signal on the target device;

wherein each of the plurality of windows includes a respective subset of the plurality of load pins of the high fanout signal, and one or more of the subsets includes two or more of the load pins;

replicating, via the computer, a source of the high fanout signal resulting in a plurality of sources, wherein each window is associated with one of the plurality of sources of the high fanout signal;

via the computer, for each source of the high fanout signal, connecting the source to the load pins of the window associated with the source; and placing the source within the window associated with the source; and outputting the placed circuit design.

11. The system of claim 10, wherein the determining comprises:

defining an initial window that encompasses all of the load pins; and subdividing the initial window into the plurality of windows, wherein each of the plurality of windows encompasses a number of the load pins that does not exceed a window maximum threshold.

12. The system of claim 10, wherein the operations further comprise deleting each window of the plurality of windows that comprises no load pins of the high fanout signal.

13. The system of claim 10, wherein the placing comprises:

calculating a center of gravity for each window; and for each window, locating the source associated with the window at a location corresponding to the center of gravity of the window.

14. The system of claim 10, wherein the placing comprises, for each window, locating the source associated with the window at a location within the window determined using a selected source location technique.

* * * * *